United States Patent [19]
Knoedl, Jr.

[11] Patent Number: 5,764,390
[45] Date of Patent: Jun. 9, 1998

[54] HOLOGRAPHIC METHOD FOR GENERATING THREE DIMENSIONAL CONFORMAL PHOTO-LITHOGRAPHIC MASKS

[75] Inventor: George Knoedl, Jr., Milford, N.J.

[73] Assignee: Lucent Technologies Inc., Murray Hill, N.J.

[21] Appl. No.: 622,795

[22] Filed: Mar. 27, 1996

Related U.S. Application Data

[62] Division of Ser. No. 363,058, Dec. 23, 1994, abandoned.

[51] Int. Cl.$^6$ ............................................. G03H 1/22
[52] U.S. Cl. ............................. 359/33; 359/1; 359/8; 359/12; 430/5; 355/2
[58] Field of Search ........................ 359/1, 8, 9, 15, 359/33, 12; 355/2, 47, 79; 430/4, 5

[56] References Cited

U.S. PATENT DOCUMENTS

| | | |
|---|---|---|
| 3,537,854 | 11/1970 | Grobin, Jr. et al. .................. 430/1 |
| 3,567,305 | 3/1971 | Collier et al. ........................ 359/11 |
| 3,806,221 | 4/1974 | Kiemle ................................. 359/3 |
| 3,995,948 | 12/1976 | Abe et al. ............................ 427/165 |
| 4,405,410 | 9/1983 | Sebastien ............................ 204/15 |
| 5,109,479 | 4/1992 | Williams ............................. 395/125 |
| 5,141,829 | 8/1992 | Dumas et al. ....................... 430/5 |
| 5,153,084 | 10/1992 | Foust et al. ......................... 430/5 |
| 5,178,976 | 1/1993 | Rose et al. .......................... 430/5 |
| 5,278,008 | 1/1994 | Moss et al. ......................... 430/1 |
| 5,395,718 | 3/1995 | Jensen et al. ....................... 430/5 |

FOREIGN PATENT DOCUMENTS

| | | |
|---|---|---|
| 2 221 353 | 1/1990 | United Kingdom .................. 430/1 |

*Primary Examiner*—Paul M. Dzierzynski
*Assistant Examiner*—Darren E. Schuberg

[57] ABSTRACT

A three-dimensional photo mask is formed from a substrate having a first side and a three-dimensional side. A hologram is provided on the first side of the substrate. The three-dimensional side of the substrate has a photosensitive resist material provided thereon. The hologram includes information that defines features to be imaged onto the photosensitive resist material. A method and a system are disclosed for producing the three-dimensional mask.

13 Claims, 5 Drawing Sheets

FIG. 5
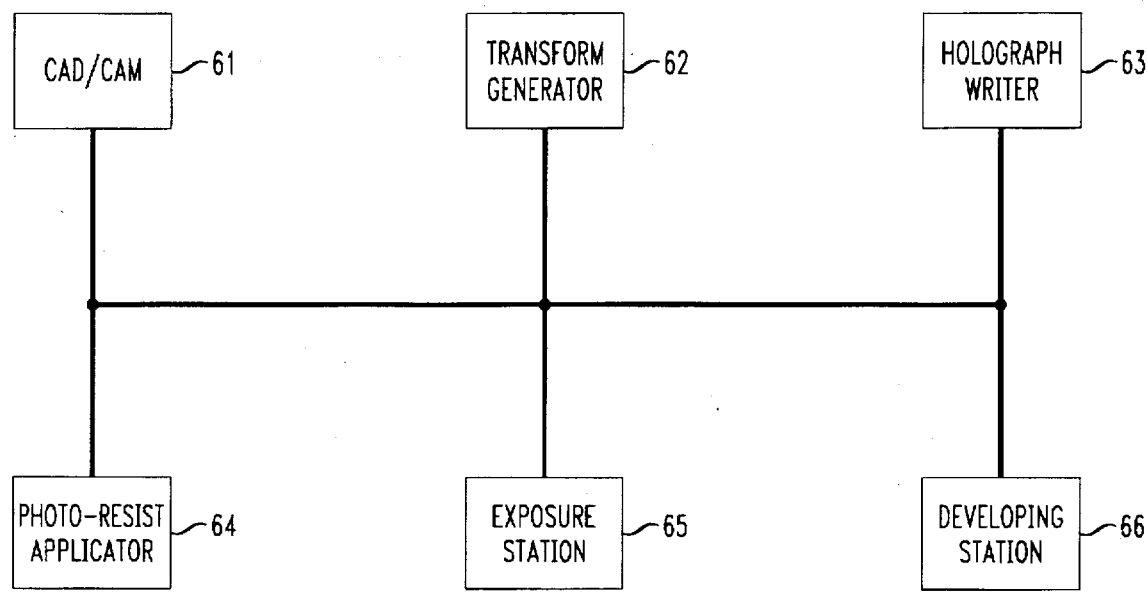
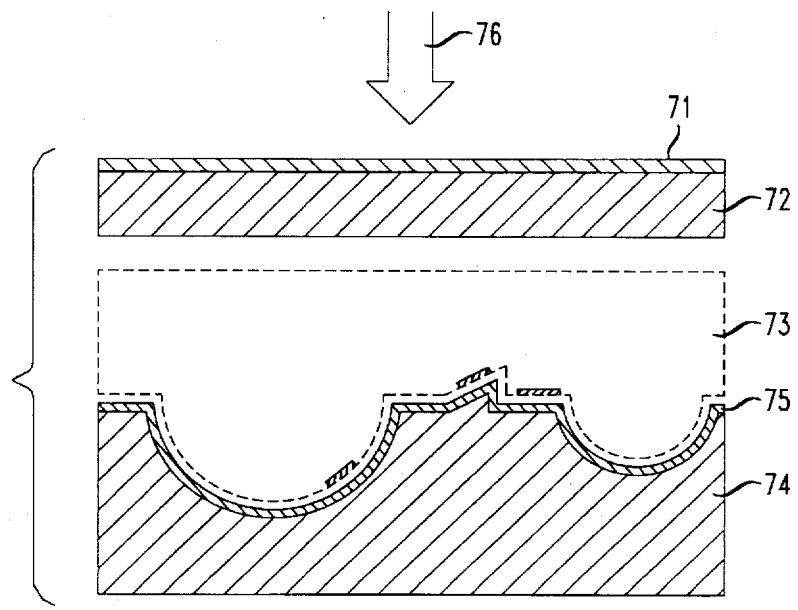
FIG. 6

HOLOGRAPHIC METHOD FOR GENERATING THREE DIMENSIONAL CONFORMAL PHOTO-LITHOGRAPHIC MASKS

This is a divisional of application Ser. No. 08/363,058 filed Dec. 23, 1994 now abandoned.

BACKGROUND OF THE INVENTION

1. Field of the Invention

The present invention relates to a photo-lithographic mask and, more particularly, to a three-dimensional conformal photo-lithographic mask formed using a hologram.

2. Description of the Related Art

It is sometimes necessary to place electrodes on a surface of a three-dimensional part. A method of designing three-dimensional electrical circuits is disclosed in U.S. Pat. No. 5,109,479. A mathematical representation of a three-dimensional object is created with a computer aided design package. A map of the flattened object is created and is then used in a computer aided circuit layout package as a printed circuit board on which an electrical circuit is placed. The electrical circuit is translated into a three-dimensional form corresponding to the surface of the object. The electrical circuit is then transferred to a three-dimensional data structure that is used to drive a numerically controlled machine tool that cuts a three-dimensional mask. The three-dimensional mask is used to print the circuit on the surface of the three-dimensional object.

Typically, a machine tool that can be used to cut the three-dimensional mask consists of a computer controlled 5-axis cutting machine. One drawback of a cutting procedure using a 5-axis cutting machine is that the 5-axis cutting machine is very costly to purchase and to operate. Since each feature must be cut individually, even using automation, the process is very time consuming. In addition, accuracy of the mask pattern is limited by the tolerances and accuracy of the cutting machine.

A holographic method of recording and reproducing etching masks is disclosed in U.S. Pat. No. 3,806,221. Substantially two-dimensional objects are holographically recorded on a hologram carrier consisting of a photographic plate carrying a photographic emulsion. To reduce the amount of distortion in the hologram image, the hologram is uniformly shrunk during development of the photographic plate. The holographic image can be reproduced as an etching mask upon a photosensitive layer on a semiconductor substrate for producing electronic components and integrated circuits. Although such a holographic mask may be useful for masking a two-dimensional surface, it is not particularly useful for masking complex three-dimensional surfaces that require a three-dimensional conformal photo mask.

A three-dimensional conformal photo mask can be formed by creating a mold having a core with a contour and forming a desired pattern of raised ribs or tracks, such as disclosed in U.S. Pat. No. 5,153,084. The ribs or tracks form a desired pattern of electrodes. The mold is used for forming a mask from a suitable transparent mask material. The mask is separated from the mold and the grooves formed by the tracks are filled with an opaque material. However, such a procedure for forming a mask is time consuming and accuracy of the mask is limited by the accuracy at which the ribs or tracks are formed.

Therefore there is a need to overcome the aforesaid problems associated with these prior art approaches to forming a photo-lithographic mask.

SUMMARY OF THE INVENTION

The present invention relates to a three-dimensional photo mask and to a method and system for forming the three-dimensional photo mask. According to an embodiment of the present invention the mask has a three-dimensional side and a planar side. A hologram is provided on the planar side of the mask. The hologram has transparent portions and portions that are opaque. The opaque portions form the holographic transformation of a pattern which is to be imaged onto the three-dimensional side of the mask or onto the part to be masked itself. According to embodiments of the present invention, a positive photosensitive resist material is placed on the three-dimensional side of the mask or on the three-dimensional part to be masked. Light is irradiated through the hologram to reproduce a three-dimensional holographic image including an image of the desired pattern that is used to expose the photosensitive resist material The photosensitive resist material is then developed to remove the areas that were exposed.

According to another embodiment of the present invention, a computer generated hologram, containing information about a three-dimensional lithographic pattern, is provided on a planar side of a two-dimensional mask blank. The mask is brought into appropriate proximity with a three-dimensional part. Light is irradiated through the hologram to produce a three-dimensional holographic image including an image of the desired pattern that is used to expose the photoresist provided on the three-dimensional part.

In other words, according to embodiments of the present invention, each mask can be accurately produced first by computer generation of a hologram, containing information about a three-dimensional lithographic pattern, at the planar side of a transparent conforming mask blank. With photoresist coated onto either the contoured side of the mask or on the part itself, by proper illumination of the hologram, a three-dimensional holographic image including an image of the desired pattern is produced and is exposed into the photoresist at the contoured surface of the three-dimensional mask or on the part itself.

BRIEF DESCRIPTION OF THE DRAWINGS

So that one skilled in the art to which the subject invention appertains will better understand how to practice the present invention, preferred embodiments of the invention will be described in detail below with reference to the drawings wherein:

FIG. 5 is a block diagram of a system for producing a three-dimensional photo mask according to an embodiment of the present invention; and FIG. 6 is a schematic sectional view illustrating a photo mask according to an embodiment of the present invention.

DETAILED DESCRIPTION OF PREFERRED EMBODIMENTS

Figure 1A:
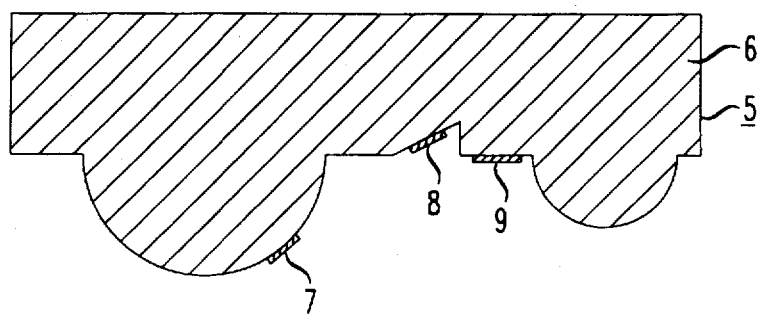
FIGS. 1(a) and 1(b) are schematic sectional views illustrating a mask and a three-dimensional printed circuit board.
Figure 1B:
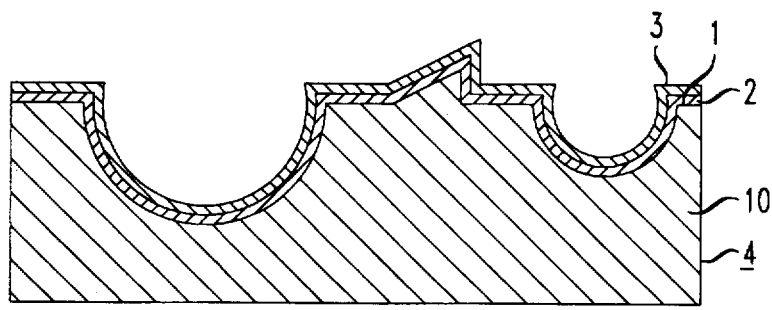

FIG. 1(b) depicts a three-dimensional printed circuit board 4 on which electrodes or an electronic circuit are to be provided on three-dimensional surface 1. Printed circuit board 4 is formed from substrate 10, having a metal-cladding layer 2 formed thereon. Substrate 10 and metal layer 2 form a metal-clad substrate. Metals such as copper, silver, nickel, tin, lead, gold, titanium, platinum and aluminum are typically used for the metal cladding. A positive photosensitive resist material layer 3 is provided on metal-cladding layer 2.

A three-dimensional photo-mask is used for photolithographically imaging selected areas on the surface of the three-dimensional printed circuit board. The printed circuit board is then etched to produce the desired circuit pattern. Generally, as depicted in FIG. 1(a), a three-dimensional mask 5 is made of a transparent and compliant substrate material 6. Portions 7–9 of the mask are coated or treated to form opaque areas having a desired pattern. The desired pattern corresponds to a pattern of electrodes to be formed on printed circuit board 4, for example.

Three-dimensional mask 5 is pressed firmly against positive photosensitive resist layer 3 provided on the surface of three-dimensional printed circuit board 4. The compliant mask material complies and forms to any irregularities on the surface of the three-dimensional printed circuit board. Light is irradiated through the mask and onto photosensitive resist layer 3, photolithographically exposing the photosensitive resist layer 3 with the desired pattern. The exposed portions of the photosensitive resist material (i.e., areas corresponding to the transparent areas of the mask) are then removed with a solvent. Three-dimensional printed circuit board 4 is then etched to remove the portions of the metal cladding 2 exposed through the resist, to form the printed circuit pattern.

Figure 2A:
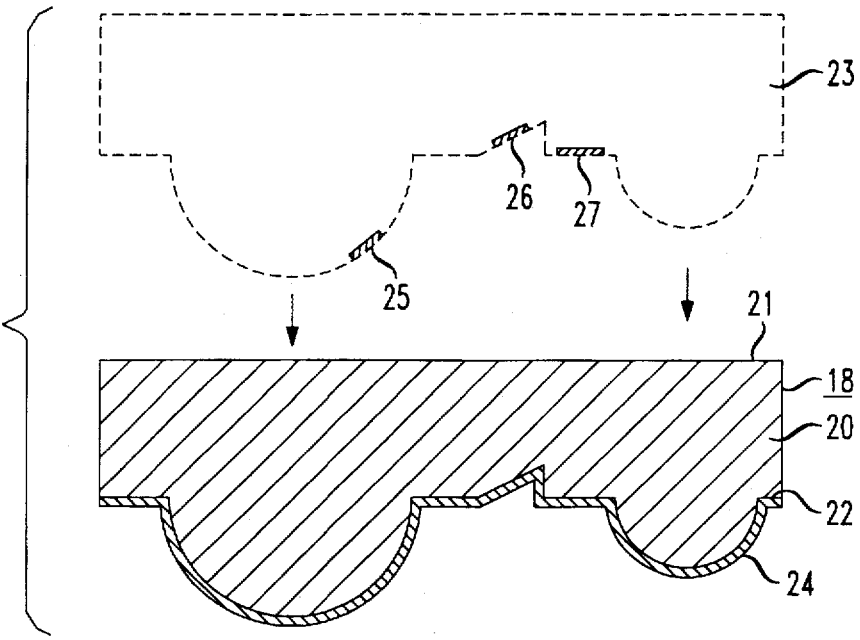
FIGS. 2(a) and 2(b) are schematic sectional views illustrating a conformal photo mask according to embodiments of the present invention.

A three-dimensional conformal photo mask according to a preferred embodiment of the present invention is depicted in FIG. 2(a). The three-dimensional conformal photo mask 18 consists of a main substrate 20 having a substantially planar side 21 and a three-dimensional mating impression side 22. Main substrate 20 is formed from a transparent material so that light can be projected therethrough. In addition, main substrate 20 is formed from a compliant material that conforms easily to any imperfections or irregularities on the surface of a three-dimensional part to be masked. An example of a material that can be used for forming main substrate 20 is General Electric Company's room temperature vulcanized (RTV) silicones such as mixtures of organopolysiloxanes containing vinyl groups.

For reference purposes, a hologram is defined as the recorded information of a three-dimensional image that is formed, for example, on a photographic plate or material. A holographic image is defined as the three-dimensional image thus reproduced by proper illumination of the hologram.

Figure 3A:
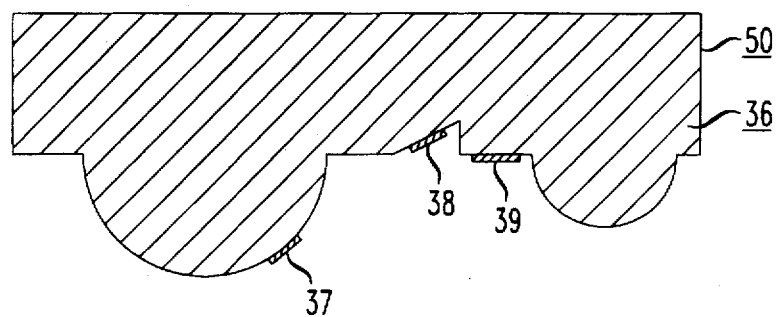
FIGS. 3(a) and 3(b) are schematic sectional views illustrating a conformal photo mask according to an embodiment of the present invention.

As shown in FIG. 2(a), reference numeral 23 represents a three-dimensional holographic image generated by proper illumination of a hologram that is recorded on planar side 21 of main substrate 20. (Although the holographic image is depicted above the mask, the holographic image would actually be formed within main substrate 20 so that dark portions 25–27 of the holographic image would prevent exposure of the corresponding portions of photo resist 24.) Accordingly, main substrate 20 should also be a material on which holographic information can be written or recorded. In the alternative, a layer of a suitable material (not shown) on which the holographic information can be written or recorded can be provided on planar side 21 of main substrate 20. Alternatively, the hologram can be carried on a mating planar plate (not shown) that is brought into proximity with planar side 21 of main substrate 20. According to this embodiment of the present invention, the hologram includes information defining features representing a "positive" of the pattern that is to be imaged onto photosensitive resist material 24. That is, portions 25, 26 and 27 of hologram 23 are dark and the rest of the hologram is illuminated. A positive photosensitive resist material 24 is provided on three-dimensional mating impression side 22 of main substrate 20. After exposure of the photosensitive resist material to the information contained in the hologram, the resist material is developed and portions removed, resulting in the three-dimensional conformal photo mask depicted in FIG. 3(a). The resulting conformal photo mask 50 as depicted in FIG. 3(a), consists of transparent main substrate 36 having opaque features 37–39.

According to another embodiment of the present invention, the photosensitive resist material can be provided only on the three-dimensional part itself. The holographic image generated by proper illumination of the hologram can then be used to expose a photosensitive resist material provided on the three-dimensional part itself. Therefore, according to this embodiment of the present invention, it is not necessary to provide the photosensitive resist material on the three-dimensional surface of the mask.

Figure 2B:
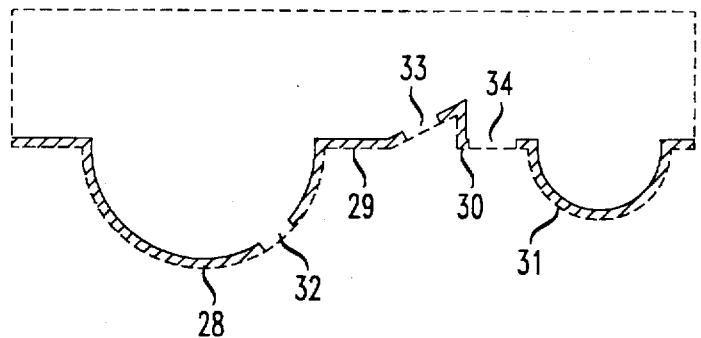

According to another preferred embodiment of the present invention as depicted in FIG. 2(b), the hologram includes information defining features representing a "negative" of the pattern that is to be imaged onto the photosensitive resist material. That is, as shown in FIG. 2(b), the holographic image consists of dark sections 28–31 and illuminated sections 32–34. In this embodiment, a negative photosensitive resist material, instead of a positive photosensitive resist material, is provided on the three-dimensional mating impression side 22 of main substrate 20. After exposure of the negative photosensitive resist material to the holographic image, the unexposed portions of the resist material (i.e., the portions corresponding to dark portions 28–31 of the hologram) are removed resulting in three-dimensional conformal photo mask 50 depicted in FIG. 3(a).

Figure 3B:
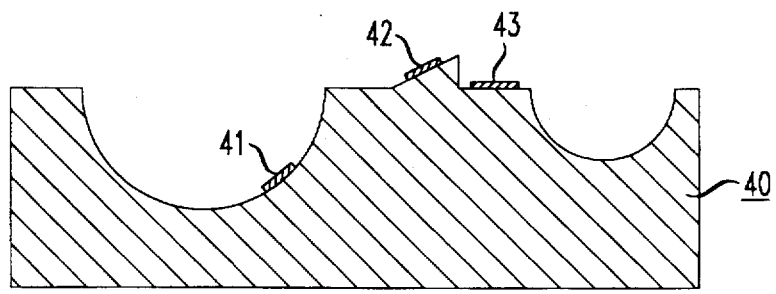

Mask 50 can then be used for photolithographically exposing three-dimensional printed circuit board 40 in any conventional manner. Printed circuit board 40 (shown in FIG. 3(b) after exposure and etching) is identical to printed circuit board 4 depicted in FIG. 1(b) prior to exposure and etching. As shown in FIGS. 3(a) and 3(b), opaque areas 37–39 of mask 50 correspond to electrodes 41–43 on three-dimensional circuit board 40.

Figure 4:
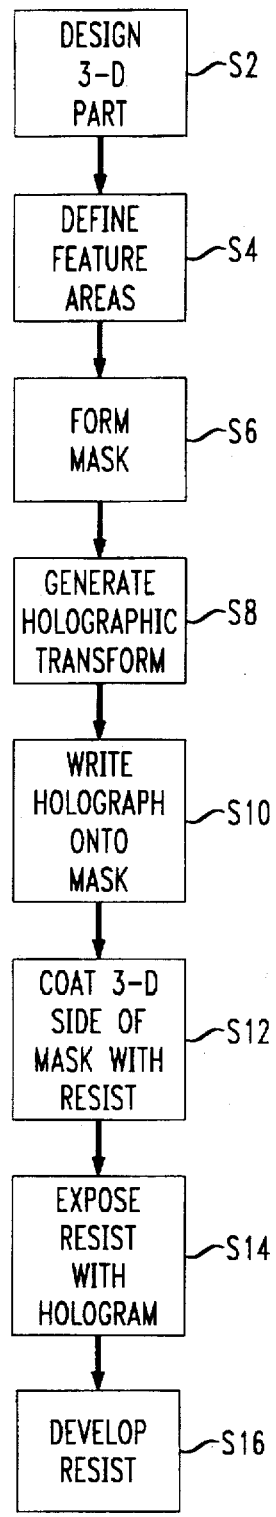
FIG. 4 is a flow chart of a method for producing a three-dimensional photo mask according to an embodiment of the present invention.

The following is a description of the steps for preparing the three-dimensional photo mask according to an embodiment of the present invention, as shown in FIG. 4. In step S2, a three-dimensional part such as a three-dimensional printed circuit board is designed. In step S4, feature areas on the surface of the three-dimensional printed circuit board on which electrodes are to be provided are numerically defined. In step S6, a conforming mask having a mating impression of the three-dimensional printed circuit board is formed. In step S8, using information generated in step S4 that numerically defines the electrode areas, Fresnel or Fourier holographic transform information of the electrode areas is generated. In step S10, the holographic transform information generated in step S8 is written or recorded onto a planar side of the three-dimensional conformal photo mask to form a hologram. In step S12, the three-dimensional side of the three-dimensional mask is coated with a positive photosensitive resist material. In step S14, a coherent light source is irradiated through the hologram and a mask to form a holographic image which defines features to be imaged onto the photosensitive resist material provided on the three-dimensional side of the mask and exposes the features onto the three-dimensional side of the mask. In step S16, the photosensitive resist material is developed to remove the exposed portions of the photosensitive resist material. As shown in FIGS. 3(a) and 3(b), mask 50 forms a mating impression of three-dimensional printed circuit board 40 and includes opaque areas 37–39 that correspond to electrode areas 41–43 on three-dimensional printed circuit board 40.

A system such as that shown in FIG. 5 is provided for producing a three-dimensional conformal photo mask according to an embodiment of the present invention. The system includes a computer aided design/computer aided manufacturing (CAD/CAM) system 61 for designing and manufacturing a three-dimensional part such as a three-dimensional printed circuit board. An example of a CAD-CAM is system is an Apollo workstation using the GMS CAD-CAM system by Unisys Corporation. Of course, any appropriate CAD-CAM system can be used.

The CAD system is used to design a three-dimensional part. The CAD system is then used to generate information numerically defining areas on a surface of the three-dimensional part that are to include electrodes, for example. After the design is complete, the three-dimensional part can be manufactured from any suitable material.

A three-dimensional mask conforming to the three-dimensional part is then made. The conforming mask can be easily designed and manufactured using the information generated by the CAD/CAM system for designing and manufacturing the three-dimensional part.

A transform generator 62 is used to generate Fresnel or Fourier holographic transform information including information-defining features to be imaged onto the three-dimensional mating impression side of the mask that correspond to the numerically defined areas on the surface of the three-dimensional part that are to have the electrodes. Transform generator 62 can be, for example, a personal computer having software suitable for generating the appropriate Fresnel or Fourier holographic transform information. An example of a software package suitable for this task is Mathmatica® by Wolfram Research or the C-Programming Language, commercially available through Borland International Inc. or Microsoft.

The generated information is written onto the planar side of the mask opposite the three-dimensional mating impression side, using hologram writer 63. The holographic information can be written onto the mask using any suitable method and apparatus. For example, the holographic information can be written or recorded using any conventional photolithographic mask writing device.

After the holographic information is written onto the mask to form the hologram, a photosensitive resist material is applied to the three-dimensional side of the mask by photo-resist applicator 64. The photosensitive resist material can be applied in any suitable manner. For example, the photosensitive resist material can be applied to the three-dimensional side of the mask either as a dry film photo resist or as a liquid photo resist.

In exposure station 65, a holographic image is exposed onto the photosensitive resist material applied on the three-dimensional side of the mask, using the information in the hologram and a coherent light source such as a LASER. There is a possibility that internal reflections from the three-dimensional surface of the mask will inadvertently expose undesired portions of the photosensitive resist material. Accordingly, it may be preferable to immerse the photosensitive resist coated mask in an index matched liquid filled with a light absorbing material or in a container having optically black walls. The index matched liquid will prevent surface reflections and the light absorbing material or container having optically black walls will absorb the light preventing further reflections from the container walls. The exposed photo resist is then developed in developing station 66 to remove the undesired portions of the photosensitive resist material. For example, when a positive photosensitive resist material is used, areas of the photo resist exposed to the light undergo a physical change rendering these areas soluble to a developing solution. The exposed areas are then removed using an appropriate solvent. On the other hand, when a negative photosensitive resist material is used, areas of the photo resist exposed to the light undergo a change rendering them insoluble to the developing solution. The unexposed areas are then removed using an appropriate solvent.

It should be noted that some photosensitive resist materials that can be used for forming the opaque portions of the mask may tend to break down after repeated masking exposures. Accordingly, it may be desirable to replace the resist material with a more durable material.

Although the above descriptions relate to the use of a hologram for forming a pattern on the three-dimensional side of a mask, the present invention is also useful for forming a pattern directly on the three-dimensional part itself using a planar photo mask blank. For example, as shown in FIG. 6, a computer generated hologram 71 can be provided on a planar, transparent photo mask blank 72, the hologram containing information about a desired three-dimensional lithographic pattern. The mask can be brought into the appropriate proximity with a three-dimensional part 75 (which is similar to printed circuit board 4 as shown in Fig. 1(b). By proper illumination of hologram 71 using an appropriate light source 76, a three-dimensional holographic image 73 including an image of the desired pattern can be reproduced to expose the photoresist 74 directly on part 75 itself. The part can then be treated to remove the undesired portions of the photosensitive resist and the exposed metal cladding can be etched to form the desired pattern of electrodes.

It will be appreciated that the foregoing description and drawings are only intended to be illustrative of the present invention. Variations, changes, substitutions and modifications of the present invention may occur to those skilled in the art without departing from the spirit and scope of the present invention. Accordingly, it is intended that the present invention be limited only by the scope of the appended claims.

What is claimed is:

1. A system for producing a three-dimensional mask, the mask having a planar side and a three-dimensional side directly opposite the planar side for mating with a three-dimensional part to be treated, said system comprising:

means for defining feature areas on a surface of the three-dimensional part to be treated;

means for generating information for forming a hologram including information that represents features relating to the feature areas defined by the defining means, the information included in the hologram defining features to be imaged onto the three-dimensional side of the mask for mating with the three-dimensional part to be treated;

means for writing information generated by the generating means onto the planar side of the mask to form a hologram;

means for irradiating light through the hologram on the planar side of the mask to expose a portion of material on the three-dimensional side of the mask in a pattern according to the hologram to create exposed and unexposed portions of the material; and means for removing one of the exposed or unexposed portions of the material provided on the three-dimensional side of the mask.

2. A system for producing a three-dimensional mask according to claim 1, further comprising means for irradiating light through the mask and onto the three-dimensional part to be treated.

3. A system for producing a three-dimensional mask according to claim 1, wherein the exposing means includes means for preventing reflection from the three-dimensional side of the mask.

4. A system for producing a three-dimensional mask according to claim 3, wherein the preventing means comprises an index matched liquid.

5. A system for producing a three-dimensional mask according to claim 4, wherein the index matched liquid includes a light absorptive material.

6. A system for producing a three-dimensional mask according to claim 4, wherein the preventing means further comprises a container having optically black walls for containing the index matched liquid.

7. The system of claim 1 wherein said means for writing information generated by the generating means onto the planar side of the mask to form a hologram comprises means for writing said information directly on said planar side to form said hologram.

8. The system of claim 1 wherein said means for writing information generated by the generating means onto the planar side of the mask to form a hologram comprises means for forming a layer of material containing said hologram directly on said planar side.

9. The system of claim 1 wherein said means for writing information generated by the generating means onto the first side of the mask to form a hologram comprises means for providing a mating planar plate bearing said hologram in direct proximity with said planar side.

10. A system for producing a three-dimensional mask, the mask having a planar side and a three-dimensional side directly opposite the planar side for mating with a three-dimensional part to be treated, said system comprising:

means for defining feature areas on a surface of the three-dimensional part to be treated;

means for generating information for forming a hologram including information that represents features relating to the feature areas defined by the defining means, the information included in the hologram defining features to be imaged onto the three-dimensional side of the mask for mating with the three-dimensional part to be treated; and means for writing information generated by the generating means onto the planar side of the mask to form a hologram.

11. The system of claim 10 wherein said means for writing information generated by the generating means onto the planar side of the mask to form a hologram comprises means for writing said information directly on said planar side to form said hologram.

12. The system of claim 10 wherein said means for writing information generated by the generating means onto the planar side of the mask to form a hologram comprises means for forming a layer of material containing said hologram directly on said planar side.

13. The system of claim 10 wherein said means for writing information generated by the generating means onto the planar side of the mask to form a hologram comprises means for providing a mating planar plate bearing said hologram in direct proximity with said planar side.

* * * * *